United States Patent
Spijker et al.

(10) Patent No.: US 7,242,740 B2
(45) Date of Patent: Jul. 10, 2007

(54) DIGITAL PHASE-LOCKED LOOP WITH MASTER-SLAVE MODES

(75) Inventors: Menno Tjeerd Spijker, Ottawa (CA); Krste Mitric, Ottawa (CA)

(73) Assignee: Zarlink Semiconductor Inc., Ottawa, Ontario (CA)

( * ) Notice: Subject to any disclaimer, the term of this patent is extended or adjusted under 35 U.S.C. 154(b) by 695 days.

(21) Appl. No.: 10/249,515

(22) Filed: Apr. 16, 2003

(65) Prior Publication Data

US 2004/0208256 A1 Oct. 21, 2004

(51) Int. Cl.
*H03D 3/24* (2006.01)
(52) U.S. Cl. .................. 375/376; 375/276; 375/215
(58) Field of Classification Search ............ 375/215, 375/376, 276, 360, 371, 354
See application file for complete search history.

(56) References Cited

U.S. PATENT DOCUMENTS

| | | | |
|---|---|---|---|
| 5,194,828 A * | 3/1993 | Kato et al. | 331/1 A |
| 5,589,795 A * | 12/1996 | Latva-Aho | 327/553 |
| 5,602,884 A * | 2/1997 | Wieczorkiewicz et al. | 375/376 |
| 5,781,054 A * | 7/1998 | Lee | 327/231 |
| 5,926,515 A * | 7/1999 | Park | 375/376 |
| 6,597,754 B1 * | 7/2003 | Janesch et al. | 375/376 |
| 6,903,615 B2 * | 6/2005 | Landman et al. | 331/57 |
| 2002/0027966 A1 * | 3/2002 | Fukuhara | 375/376 |
| 2002/0044620 A1 * | 4/2002 | Spijker et al. | 375/371 |
| 2003/0076177 A1 * | 4/2003 | Fischer | 331/17 |
| 2004/0202261 A1 * | 10/2004 | Gregorius | 375/354 |

OTHER PUBLICATIONS

Ambassador® T8100A, T8102, and T8105 H, 100/H.110 Interfaces and Time-Slot Interchangers, Nov. 1999.
Jitter and PLL Considerations for the Ambassador® Family of Time-Slot Interchangers, Sep. 1998.
ML53812-2 H.100/H.100 CT Bus System Interface and Time-Slot Interchange, Jan. 2000.
Technical Note TN90866.2 MT90866 ENG 2 Errata Sheet, Oct. 2001.

* cited by examiner

*Primary Examiner*—Chieh M. Fan
*Assistant Examiner*—Julia Tu
(74) *Attorney, Agent, or Firm*—Marks & Clerk

(57) ABSTRACT

A digital phase locked loop (DPLL) for providing clock synchronization in backplane bus systems has a loop filter with selectable high and low bandwidth modes. The DPLL is thus capable of respectively attenuating or tracking jitter from an input reference clock.

26 Claims, 3 Drawing Sheets

DIGITAL PHASE-LOCKED LOOP WITH MASTER-SLAVE MODES

BACKGROUND OF INVENTION

This invention relates to the field of digital communications, and in particular clock synchronization in systems employing a backplane bus.

In switching systems where several cards are connected to a common data bus, it is important that clock distribution and synchronization be done such that re-arrangements in the clock distribution do not affect data transport over the common data bus. Standards, such as the ECTF H.110 standard, describe the implementation of a common data bus and a clocking scheme to ensure that no data disruptions occur due to clocking re-arrangements.

The ECTF H.110 standard defines timing devices within the system as "primary master", "secondary master" or "slave". The "primary master" and "secondary master" devices are capable of synchronizing to a network reference clock and driving one of the two independent backplane bus clock/frame pulse pairs. The backplane bus clock is 8.192 MHz while the backplane bus frame pulse is 8 kHz. The "slave" devices use the main backplane bus clock and frame pulse, the "A" clocks for synchronization to the backplane bus. The "A" clocks are driven by the "primary master" and are derived from a local network reference or a system wide network reference. A second pair consisting of a backplane bus clock and frame pulse, the "B" clocks are used as a backup clock on the backplane. The "B" clocks are driven by the "secondary master". During normal operation, the "secondary master" and "slaves" are synchronized to the "A" clocks. When the "A" clocks becomes unreliable, the "slave" devices switch from using the "A" clocks to the "B" clocks for synchronization to the backplane bus. To ensure that during the switch from the "A" clocks to the "B" clocks, no data is lost, the "B" clocks must be phase locked with a minimum phase offset to the "A" clocks when the "A" clocks are reliable. When the "B" clocks are the main clocks on the backplane, the "secondary master" device that drives the "B" clocks switches from using the "A" clocks to using a network clock as its reference without disrupting data traffic on the backplane bus.

In order to meet all the requirements of synchronization and clock switching without the loss of data, the "secondary master" device must use a Phase Locked Loop (PLL) that can track the "A" clocks closely even in the presence of jitter. Therefore the "secondary master" should pass the jitter on the "A" clocks on to the "B" clocks. While not strictly required by the ECTF H.110 standard, it is also preferable for the "primary master" to attenuate jitter from the network reference clock while driving the "A" clocks. However, in order for the "Secondary master" to track the jitter on the "A" clocks, the PLL driving the "B" clocks may not attenuate the jitter. Since a "secondary master" or "slave" can become a "primary master", the DPLLs in these devices must track the "A" clocks continuously. Also, they must be able to switch from one input reference to another and at the same time switch from no jitter attenuation to jitter attenuation without disrupting the backplane clock and frame pulse.

Prior art implementations have not been able to provide these mixed jitter attenuation requirements without disrupting data during clock re-arrangements.

SUMMARY OF INVENTION

According to the present invention there is provided a digital phase locked loop (DPLL) for providing clock synchronization in backplane bus systems, which has a loop filter having selectable high and low bandwidth modes for respectively attenuating or tracking jitter from an input reference clock.

The invention allows one single device to be employed to perform both main roles required by the H.110 standard, namely synchronizing to a network clock with jitter attenuation, and synchronizing to a backplane clock without jitter attenuation. The invention also allows automatic reference switching from a reference where jitter attenuation is required, to a reference where jitter must not be attenuated and vice versa, without any significant output clock phase jump. The invention is thus capable of both attenuating and tracking incoming clock jitter while maintaining output clock integrity (preventing any significant change in the output phase) during and after switch from one input reference to another.

The Digital Phase Locked Loop (DPLL), containing this invention, used in combination with a digital switch, can form a device that is fully compliant to the H.110 timing specifications. The same device can be used to perform the roll of any of the three H.110 required devices: "primary master", "secondary master" and "slave", without any additional logic and with good performance, thereby drastically reducing the cost for building such part or system.

The loop filter of the DPLL can be switched between a low bandwidth mode, thereby attenuating jitter, and a high bandwidth mode, thereby passing the jitter on the input clock on to the output clock of said DPLL. A non-linear phase transfer in the high bandwidth mode ensures that the output clock of said DPLL has no significant phase jumps when the filter is switched from a high bandwidth to a low bandwidth. The non-linear phase transfer in the high bandwidth mode also improves the holdover accuracy of said DPLL in the high bandwidth mode.

The divider circuit of the DPLL that generates the 8 kHz output frame pulse from the DPLL output clock has a synchronization circuit built in that ensures that the output frame pulse is aligned with the input frame pulse of the DPLL in high bandwidth mode. In this way, both the output clock and frame pulse of said DPLL can be aligned with the input clock and frame pulse.

In another aspect the invention provides a clock generation circuit, comprising a multiplexer for receiving selecting one of a plurality of input reference clock signals; and a digital phase locked loop including a maximum time interval error (MTIE) detector having first and second inputs, said first input being coupled to an output of said multiplexer; a phase detector coupled to an output of said MTIE detector; a loop filter coupled to an output of said phase detector, said loop filter having selectable high and low bandwidth modes for respectively attenuating or tracking jitter from an input reference clock signal; a digital controlled oscillator coupled to an output of said loop filter; and an output divider coupled to an output of said digital controlled oscillator for generating output clocks and an output frame pulse, said output divider having an output connected to an input of said MTIE detector.

BRIEF DESCRIPTION OF DRAWINGS

The invention will now be described in more detail, by way of example only, with reference to the accompanying drawings, in which.

DETAILED DESCRIPTION

Figure 1:
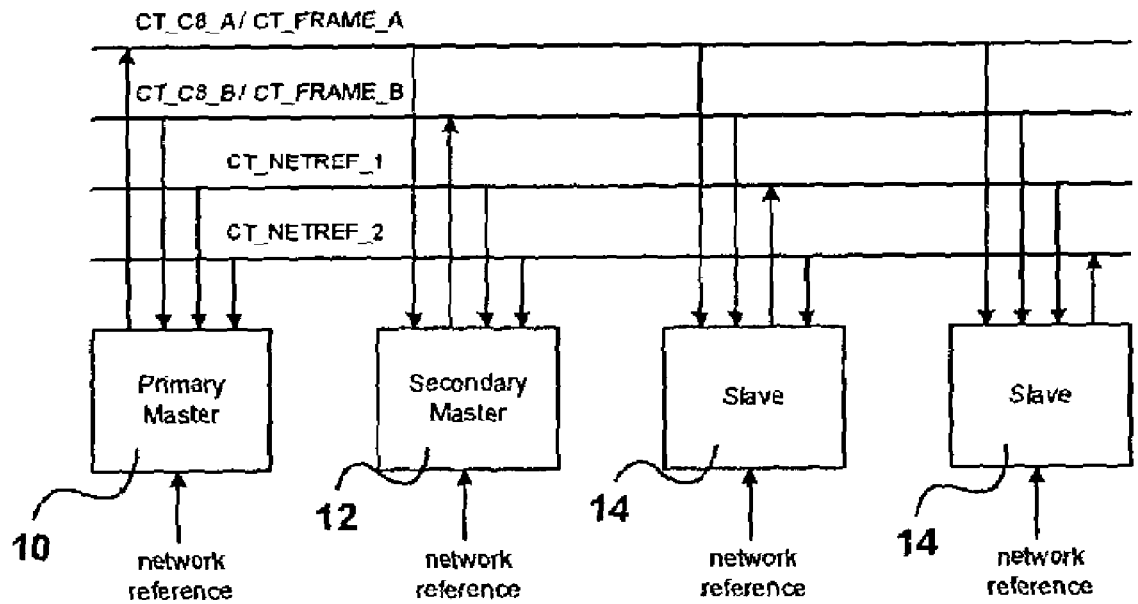
FIG. 1 is a diagram of a typical H.110 timing control configuration.

As shown in FIG. 1, a typical H.110 compliant system consists of a primary master 10, a secondary master 12 and multiple slave devices 14. A DPLL (Double Phase Locked Loop) in the primary master 10 is locked to either a locally derived network reference or a system wide network reference (CT_NETREF_1 or CT_NETREF_2) and drives the "A" clocks (CT_C8_A and CT_FRAME_A). The system wide network references are typically driven by two of the slave devices 14. The CT_NETREF clocks are derived from the slaves" local network references and do not have a specific phase with respect to each other or the bus clocks CT_C8_A/B and CT_FRAMEA/B. A DPLL of the secondary master 12 is locked to the "A" clocks and generates the "B" clocks. The slaves 13 monitor the "A" and "B" clocks, and the DPLL of each of the slaves 14 is locked to the "A" clocks.

If the primary reference for the DPLL in the primary master 10 becomes unreliable, the DPLL in the primary master 10 continues driving the "A" clocks in stable holdover mode until it makes a Stratum 4 Enhanced compatible switch to a secondary reference being a local network reference or a CT_NETREF clock for its network timing. In stable holdover mode, the DPLL just maintains a stable output frequency.

The secondary master device 12 drives the B clocks (CT_C8_B/CT_FRAME_B), by locking to the "A" clocks generated by the primary master 10. The "B" clocks have to be phase locked and edge synchronous to the "A" clocks even in the presence of jitter on the "A" clocks. If the "A" clocks become unreliable, the secondary master 12 continues driving the "B" clocks in stable holdover mode until it makes a Stratum 4 Enhanced compatible switch to a local network reference or a CT_NETREF for its timing. The slave 14 devices are synchronized to the "A" clocks, and if the "A" clocks become unreliable, the slaves 14 make a switch to the "B" clocks.

Figure 2:
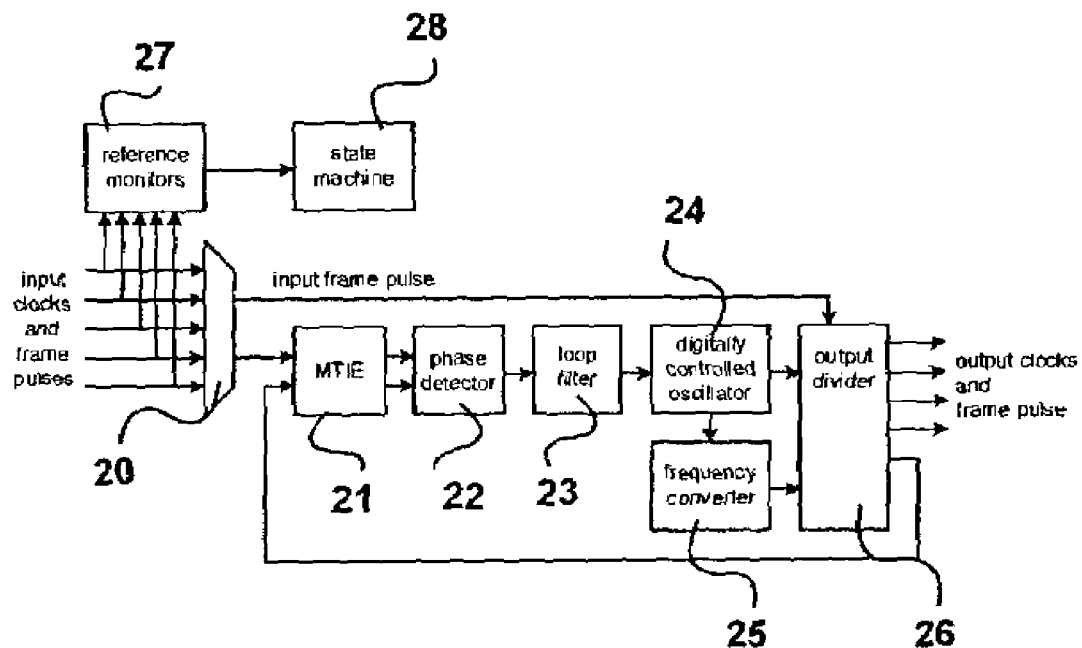
FIG. 2 is a top-level block diagram of a DPLL circuit according to a preferred embodiment of the invention.

Referring to now FIG. 2, the DPLL circuit that is capable of the functionality described above consists of the following modules: an input reference multiplexer or selector 20, an MTIE (Maximum Time Interval Error) module 21, a phase detector 22, a loop filter 23, a digitally controlled oscillator (DCO) 24, a frequency converter 25 and an output divider 26.

The input reference selector 20 selects the proper clock and/or frame pulse from the local network references, the two CT_NETREFs, the "A" clocks or the "B" clocks as the input clock for the DPLL. In case the DPLL is a secondary master or slave, it also selects the right frame pulse to synchronize the DPLL output frame pulse to.

The reference monitor modules 27 monitor the timing of the input references and notify the State Machine module 28 whether the reference is reliable or not. The State Machine 28 controls the input reference selector 20, the loop filter bandwidth and switches the DPLL automatically into holdover mode when required.

The MTIE module 21 compensates for the phase offset between the new reference input and the DPLL output clock in case of a reference switch or a recover from holdover mode.

The phase detector 22 converts phase difference between the input reference clock and output feedback clock to a signed binary number representation.

The loop filter 23 performs output phase slope limiting, filters the phase error output of the phase detector to a frequency offset signal for the DCO. The bandwidth of the DPLL is determined in the loop filter 23.

The DCO 24 is the actual clock generator. It generates a clock that is phase locked to the input reference clock. The frequency of the generated clock is determined by the system clock, the center frequency setting inside the DCO and the frequency offset value from the loop filter.

The frequency converter 25 multiplies the current phase of the DCO by a constant fraction and thereby generates a clock of a frequency that is a fraction of the DCO output clock frequency.

The output divider 26 divides the output clocks of the DCO and the frequency converter down to the required clocks and an 8 kHz frame pulse.

When the DPLL is a primary master it locks to the input clock selected by the system configuration and attenuates the jitter on the input clock. The bandwidth of the DPLL is approximately 1.5 Hz. The DPLL drives the "A" clocks CT_C8_A and CT_FRAME_A. The input clock frequency and output clock frequency are not necessarily of the same frequency. The input clock can be a 1.544 MHz clock while the output clock is the 8.192 MHz clock CT_C8_A as prescribed by the H.110 standard. The output frame pulse CT.FRAME_A is generated by dividing the 8.192 MHz clock down to 8 kHz.

When the DPLL is a secondary master 12, it locks to the 8.192 MHz "A" clock CT_C8_A as it has to generate the 8.192 MHz "B" clock CT_C8_B that is edge synchronous to the "A" clock. The DPLL does not attenuate but tracks the jitter on the CT_C8_A clock. The bandwidth of the DPLL is approximately 100 kHz. The frame pulse from the DPLL CT_FRAME_B must closely track the "A" frame pulse CT_FRAME_A. Therefore, the divider module 26 of the DPLL synchronizes the CT_C8_B frame pulse to the incoming CT_C8_A frame pulse.

When the DPLL is a slave 14, it locks to the 8.182 MHz "A" clock CT_C8_A. The DPLL does not attenuate but tracks the jitter on the CT_C8_A clock. The bandwidth of the DPLL is approximately 100 kHz. The output clocks of the DPLL are used for the switch in the slave device and the serial TDM streams.

The role of devices in the system is not fixed but may change over time. When the "A" clocks from the primary master become unreliable, the "B" clocks from the secondary master become "A" clocks and the secondary master is promoted to primary master. The primary master is demoted to slave and a slave is promoted to secondary master.

Figure 3:
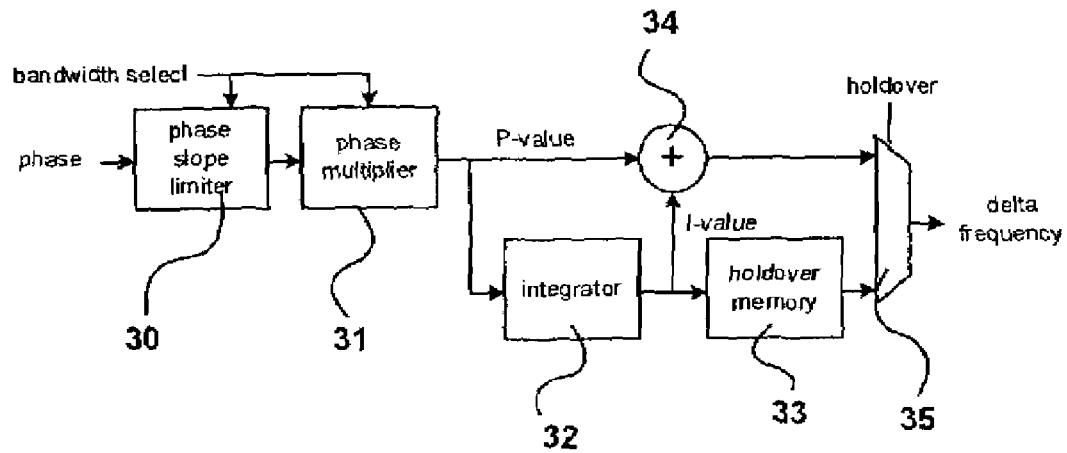
FIG. 3 is a block diagram of the loop filter module from FIG. 2.

FIG. 3 is a block diagram of the loop filter 23. The phase error value from the phase detector is passed through a limiter 30 to achieve a phase slope limiting on the DPLL output clocks when the low bandwidth is selected. When the high bandwidth is selected, there is no phase slope limiting. The limiter output is multiplied by a power of two by a barrel shifter phase multiplier 31. The multiplied output, the P(roportional)-value, is integrated in an accumulator integrator 32. The integrator value is attenuated to keep the DPLL stable and the peaking in the DPLL's jitter transfer function under control. The attenuated integrator output is the I-value in FIG. 3. The P-value and the I-value are added in adder 34 to provide the loop filter output.

The I-value is stored in two alternating locations in holdover memory 33 at regular intervals. When the DPLL is switched into holdover mode by multiplexer 35, the oldest holdover memory value is restored as the loop filter output.

The loop filter circuit 23 implements a first order low pass filter. The shift value of the barrel shifter determines the cut-off frequency. In the preferred embodiment, two shift values, 0 and 16, are implemented. The corresponding jitter cut-off frequencies are: 1.5 Hz and 100 kHz. When the DPLL is a primary master, the 1.5 Hz setting is used and the DPLL will attenuate jitter above 1.5 Hz. When the DPLL is secondary master or slave, the 100 kHz setting is used and the DPLL will pass jitter below 100 kHz on to the DPLL's output clocks.

Figure 4:
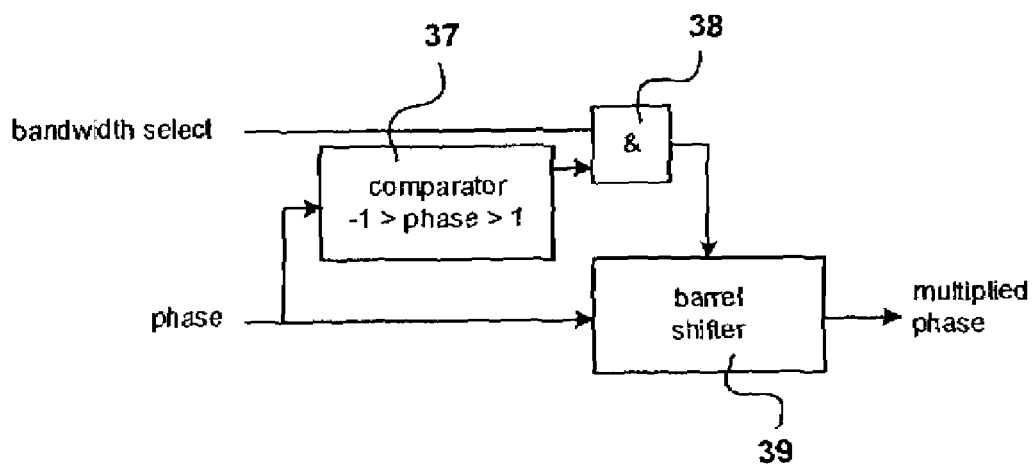
FIG. 4 is a block diagram of the phase multiplier from FIG. 3.
Figure 5:
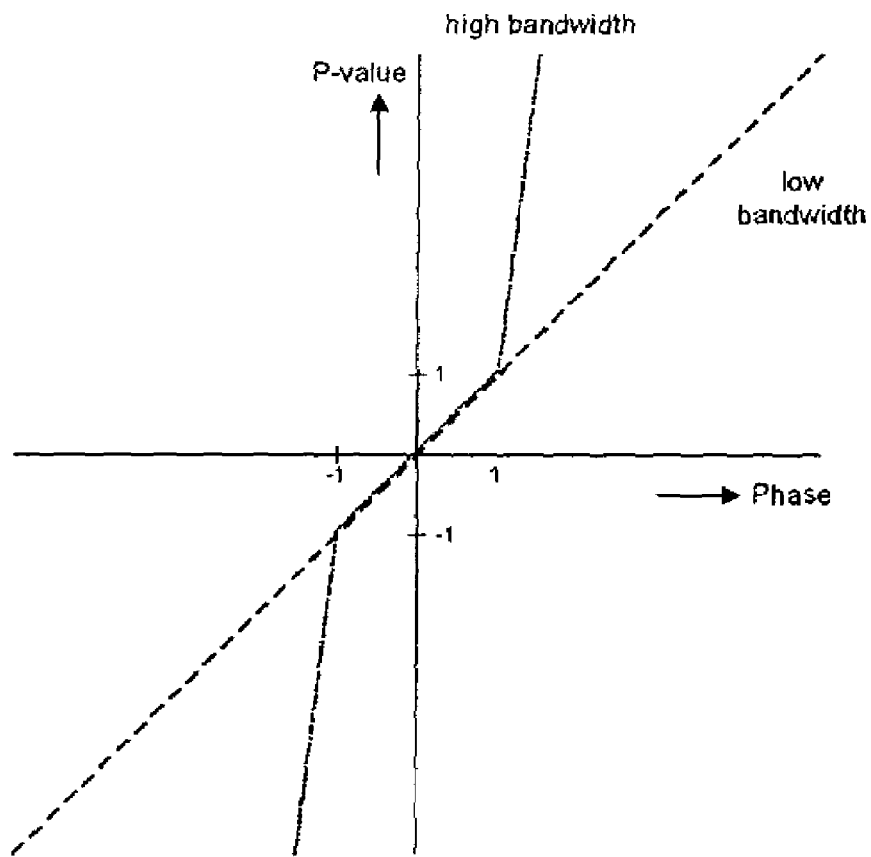
FIG. 5 is the phase transfer diagram for the phase multiplier from FIG. 4.

The output of the phase detector 22 is configured so that it outputs values that are always odd. When the DPLL is locked, the phase detector output toggles between −1 and +1. The barrel shifter multiplier 31 has a threshold built in such that it does not perform a shift when the phase error from the phase detector is −1 or +1, thereby creating a nonlinear transfer for shift values larger than zero (multiply by more than 1). This is indicated in FIG. 4, which shows the multiplier 31 consisting of phase comparator 37, AND gate 38, and barrel shifter 39.

The advantage of this arrangement is that when the DPLL is locked, the values fed into the integrator are +1 or −1 even when a shift value of 16 is used. Effectively this means that the noise of one LSB (Least Significant Bit) from the phase detector falls below the threshold and is not amplified by the barrel shifter. That reduces the noise integrator and improves the accuracy of the holdover mode dramatically. Also, without the barrel shifter threshold, a phase jump on the output clock is observed when the loop filter is switched from the 100 kHz setting to the 1.5 Hz setting. With the barrel shifter threshold in place, this output phase jump no longer exists, thereby maintaining phase integrity of the output clock.

Besides the application of a master/slave DPLL, the non-linear phase transfer loop filter is also useful for a DPLL with a relative high bandwidth in general as it improves the holdover accuracy.

The divider module 26 divides the high speed clock provided by the DCO 24 and the frequency converter 25 to provide the necessary output clocks and also to generate the feedback reference for the MTIE module 21 and the phase detector 22.

Figure 6:
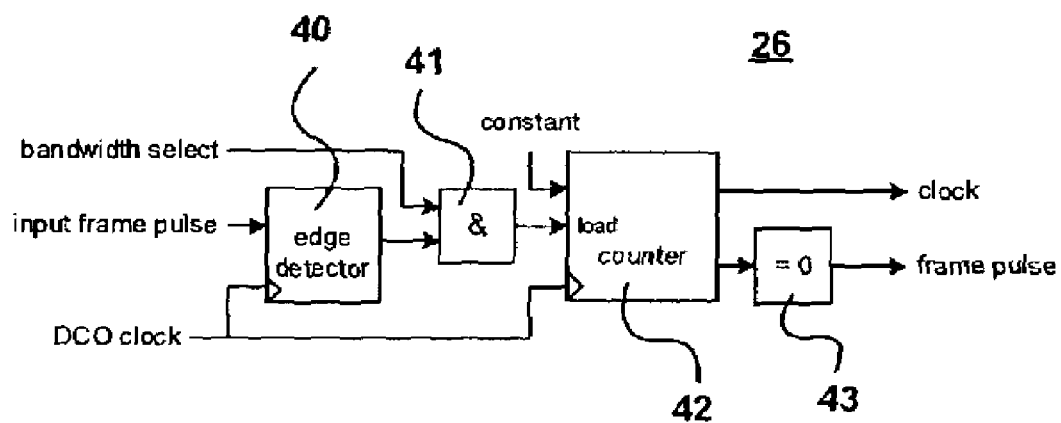
FIG. 6 is a block diagram of the divider from FIG. 3.

When the DPLL is a primary master and in low bandwidth mode, the output clocks may not be aligned with the input clock due to jitter on the input clock. When the DPLL is a secondary master or slave, the DPLL's output clock and frame pulse must be aligned to the backplane clock and frame pulse. In order to track the jitter on the backplane clock, the DPLL must lock to the backplane clock, but that means that the backplane frame pulse and the DPLL output frame pulse may not be aligned. Therefore, as shown in FIG. 6, the divider 26 has a synchronization circuit built in. This comprises edge detector 40, AND gate 41, counter 42, and zero detector 43.

At the backplane frame pulse, the counter 42 in the divider is loaded with a fixed value. The counter counts down on the DPLL output clock, and when the counter reaches zero the output frame pulse is generated. The constant value with which the counter is loaded is such that the output frame pulse is aligned with the input frame pulse. Since the DPLL output clock closely tracks the backplane input clock, this synchronization scheme ensures that the DPLL output frame pulse is phase aligned with the backplane frame pulse. The synchronization scheme is only enabled by the AND gate 41 when the high bandwidth is selected. When the low bandwidth is selected, the counter just counts down and rolls over when it reaches zero.

The described DPLL's output clock and frame pulse have no significant phase jump when the DPLL is switched from a high bandwidth to a low bandwidth. It also permits an 8 kHz output frame pulse to be generated from the DPLL's jittery output clock, which allows it to always be properly aligned to the input frame pulse.

Persons skilled in the art will appreciate that many variants of the invention are possible within the scope of the appended claims.

The invention claimed is:

1. A clock generation system for providing clock synchronization in a switching system wherein several cards are connected to a common backplane data bus, comprising:
    a primary master clock including a first digital phase locked loop with a loop filter for generating first clock signals from a reference source;
    a secondary master clock including a second digital phase locked loop with a loop filter for generating second clock signals; and
    said secondary master clock being operable in either a first mode wherein said secondary master clock is locked to said first clock signals or a second mode wherein said secondary master clock is locked to an alternative reference source; and
    wherein said loop filter in said secondary master clock is configured to be in a high bandwith mode when said secondary master clock is operating in said first mode and said loop filter in said secondary master clock is configured to be in a low bandwidth mode when said secondary master clock is operating in said second mode;
    whereby when operating in said first mode said secondary master clock tracks jitter in the clock signals generated by said primary master clock and when operating in said second mode said secondary master clock attenuates jitter from said alternative reference source.

2. The clock generation system of claim 1, wherein said first digital phase locked loop for generating in said primary master clock also has a loop filter with selectable high and low bandwidth modes, and wherein said loop filter in said primary master clock is configured to be in said low bandwidth mode when said secondary master clock is operating in said first mode so that said primary master clock attenuates jitter in said reference source.

3. The clock generation system of claim 1, wherein said loop filter in said secondary master clock is a non-linear filter with a threshold to prevent amplification of noise from a phase detector forming part of said digital phase lock loop in said secondary master clock in high bandwidth mode.

4. The clock generation system of claim 3, wherein said loop filter in said secondary master clock is a first order low pass filter.

5. The clock generation system of claim 4, wherein said loop filter in said secondary master clock includes a phase multiplier responsive to a bandwidth select signal to select said high and low bandwidth modes.

6. The clock generation system of claim 5, wherein at least said digital phase locked in said secondary master clock includes a phase detector generating a phase error, and wherein said phase multiplier includes a barrel shifter that is locked when said phase error has predefined values.

7. The clock generation system of claim 6, wherein said predefined values are −1 and +1.

8. The clock generation system of claim 6, wherein said loop filter in said secondary master clock further includes a phase slope limiter upstream of said phase multiplier and responsive to said bandwidth select signal.

9. The clock generation system of claim 8, wherein said loop filter in said secondary master clock further comprises an integrator providing integrated values of an output of said phase multiplier, and an adder for adding said integrated values to said output of said phase multiplier to provide an input to a controlled oscillator forming part of said digital phase locked loop in said secondary master clock.

10. The clock generation system of claim 9, wherein said loop filter in said secondary master clock further includes a holdover memory for storing said integrated values, and a multiplexer for selecting either an output of said adder or said holdover memory.

11. The clock generation system of claim 10, wherein said loop filter in said secondary master clock is configured so that successive integrated output values are stored at alternating locations in said holdover memory.

12. The clock generation system of claim 1, wherein at least said digital phase locked loop in said secondary master clock includes a divider receiving an input from a digital controlled oscillator forming part of said phase locked loop, said divider including a synchronization circuit that is enabled in the high bandwidth mode to align an output frame pulse of said digital phase locked loop with a backplane frame pulse.

13. The clock generation system of claim 12, wherein said synchronization circuit includes a counter that is loaded with a fixed value on receipt of said backplane frame pulse, and a circuit for generating said output frame pulse when said counter reaches a predetermined value, said fixed value being selected to align said output frame pulse with said backplane frame pulse.

14. The clock generation system of claim 13, wherein said counter is a down counter, and said predetermined value is zero.

15. The clock generation system of claim 13, wherein said synchronization circuit further includes an edge detector receiving said input pulse and providing an input to said counter.

16. The clock generation system of claim 15, further comprising a gate responsive to a bandwidth select signal between said edge detector and said counter to enable said synchronization circuit in said high bandwidth mode.

17. A clock generation circuit, comprising:
a primary master clock including a first digital phase locked loop for generating first clock signals from a reference source;
a secondary master clock including a second digital phase locked loop for generating second clock signals; and
said secondary master clock being operable in either a first mode wherein said secondary master clock is locked to said first signals or a second mode wherein said secondary master clock is locked to an alternative reference source; and
wherein at least said digital phase locked loop in said secondary master clock comprises:
a) a multiplexer for receiving selecting one of a plurality of input reference clock signals;
(b) a maximum time interval error (MTIE) detector having first and second inputs, said first input being coupled to an output of said multiplexer;
(c) a phase detector coupled to an output of said MTIE detector; a loop filter coupled to an output of said phase detector, said loop filter having selectable high and low bandwidth modes;
(d) a digital controlled oscillator coupled to an output of said loop filter; and
(e) an output divider coupled to an output of said digital controlled oscillator for generating output clocks and an output frame pulse, said output divider having an output connected to an input of said MTIE detector; and
wherein said loop filter in the digital phase locked loop of said secondary master clock is configured to be in said high bandwith mode when said secondary master clock is operating in said first mode and said loop filter of said digital phase locked loop in said secondary master clock is configured to be in said low bandwidth mode when said secondary master clock is operating in said second mode;
whereby when operating in said first mode said secondary master clock tracks jitter in said first clock signals and when operating in said second mode said secondary master clock attenuates jitter from said alternative reference source.

18. The clock generation circuit of claim 17, further comprising a reference monitor for monitoring said input reference clock signals and a state machine responsive to said reference monitor for selecting said high or low bandwidth mode of said loop filter in the digital phase locked loop of said secondary master clock.

19. The clock generation circuit of claim 18, wherein said loop filter in the digital phase locked loop of said secondary master clock includes a holdover mode, and said state machine is also responsive to said reference monitor to select said holdover mode.

20. The clock generation circuit of claim 19, wherein said loop filter in the digital phase locked loop of said secondary master clock is a non-linear filter with a threshold.

21. The clock generation circuit of claim 20, wherein said loop filter in the digital phase locked loop of said secondary master clock is a first order filter.

22. The clock generation circuit of claim 19, wherein said loop filter in the digital phase locked loop of said secondary master clock includes a phase multiplier with a barrel shifter having said threshold built in.

23. The clock generation circuit of claim 22, wherein said barrel shifter is configured not to perform a phase shift when a phase error generated by said phase detector has predefined values.

24. The clock generation circuit of claim 23, wherein said predefined values are −1 and +1.

25. The clock generation circuit of claim 17, wherein said output divider includes a synchronization circuit to align an input backplane frame pulse with said output frame pulse.

26. The clock generation circuit of claim 25, wherein said synchronization circuit includes a down counter that is loaded with a fixed value on receipt of an input frame pulse, and which generates an output frame pulse when a count thereof reaches a predetermined value.

* * * * *